United States Patent [19]

Pike

[11] Patent Number: 4,650,973
[45] Date of Patent: Mar. 17, 1987

[54] POSTAGE METER COVER ASSEMBLY

[75] Inventor: Timothy D. Pike, Hayward, Calif.

[73] Assignee: f.m.e. Corporation, Hayward, Calif.

[21] Appl. No.: 795,672

[22] Filed: Nov. 6, 1985

[51] Int. Cl.⁴ .............................................. G06F 1/106
[52] U.S. Cl. .................................... 235/1 D; 235/101
[58] Field of Search .................... 235/1 D, 101, 145 R, 235/58 CW, 58 P

[56] References Cited

U.S. PATENT DOCUMENTS 3,739,978  6/1973  Powell ........................... 235/58 CW
4,484,307  11/1984 Quatse et al. ........................ 364/900

Primary Examiner—L. T. Hix
Assistant Examiner—Brian W. Brown
Attorney, Agent, or Firm—Townsend and Townsend

[57] ABSTRACT

A cover assembly for use with a postage meter includes an upper cover having a display opening and a keypad opening formed in one side. The upper cover is secured to a lower cover to provide a housing or enclosure for the meter. A display assembly, including a character display, and a keypad are both mounted to the inner surface of the upper cover. Portions of the keypad extend through the keypad opening while the character display is visible through the display opening. A support plate is mounted to the underside of the upper cover and is shaped to generally conform to the shape of the contents beneath the cover. The support plate is configured to press against the keypad and display assembly so to secure them in place. A battery, used to power the meter when removed from the meter base, is also supported between the support plate and the upper cover.

21 Claims, 18 Drawing Figures

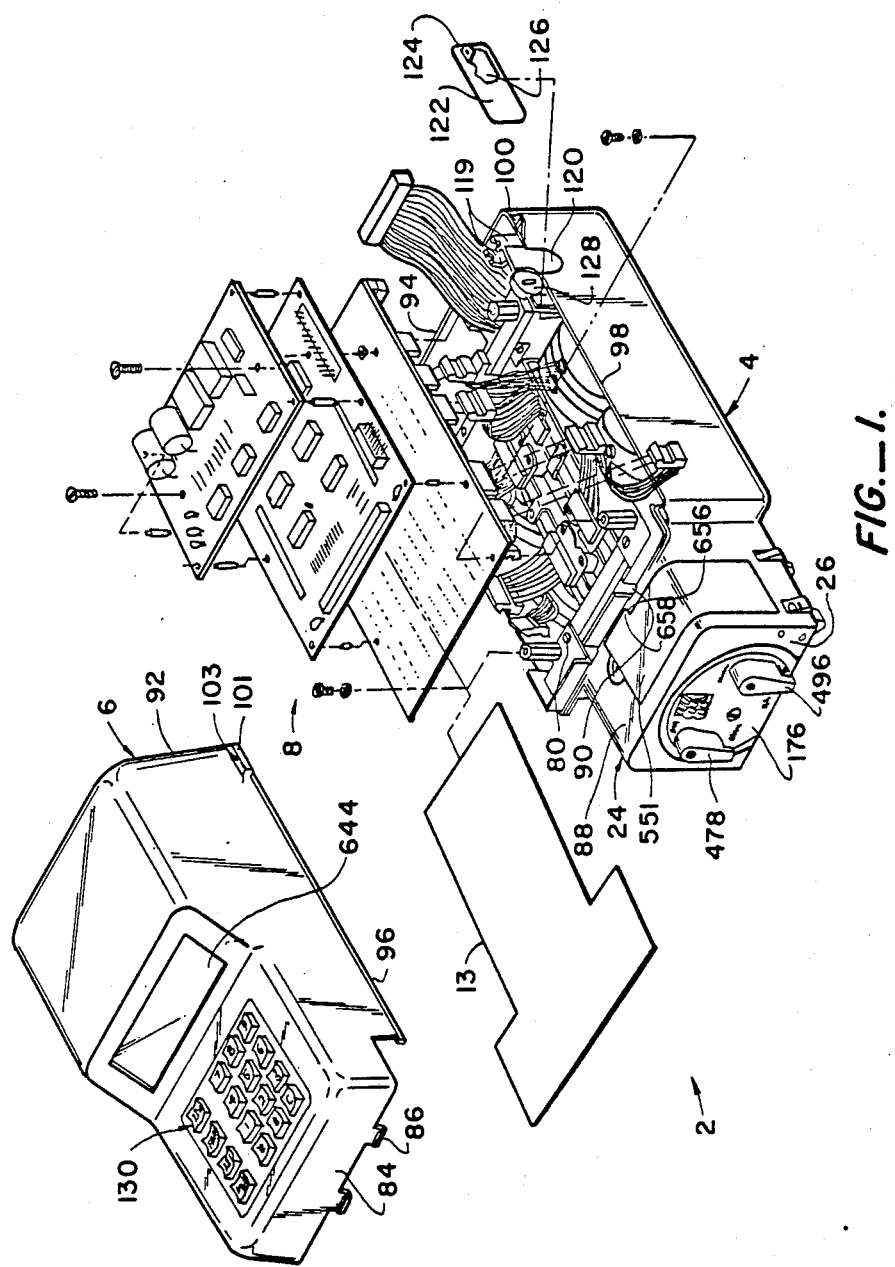
FIG.—1.

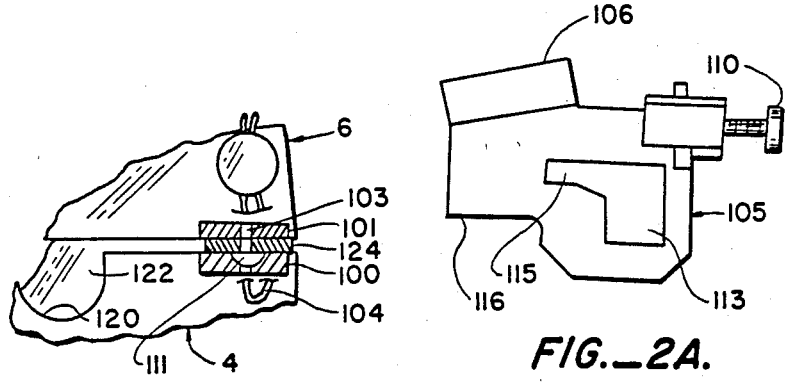
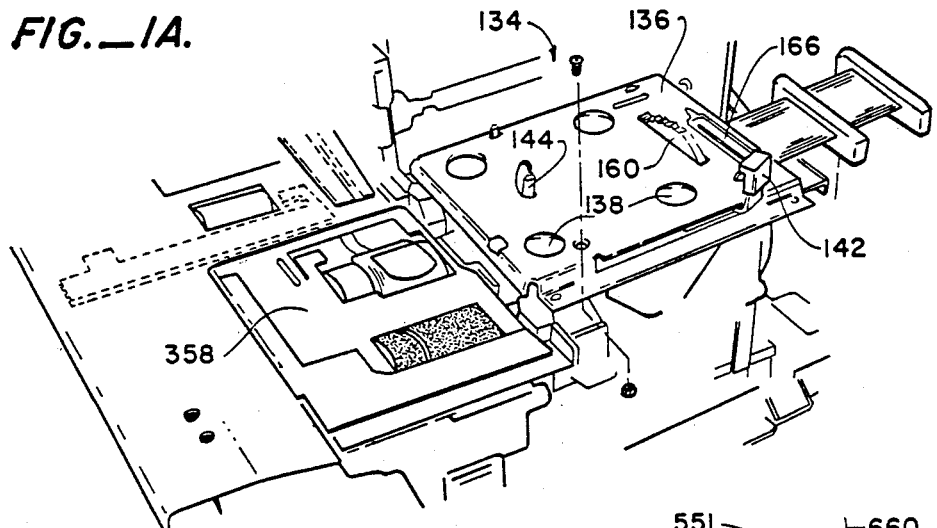
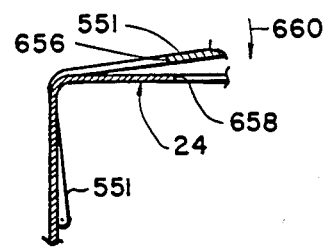
FIG._1A.
FIG._2A.
FIG._1B.
FIG._1C.

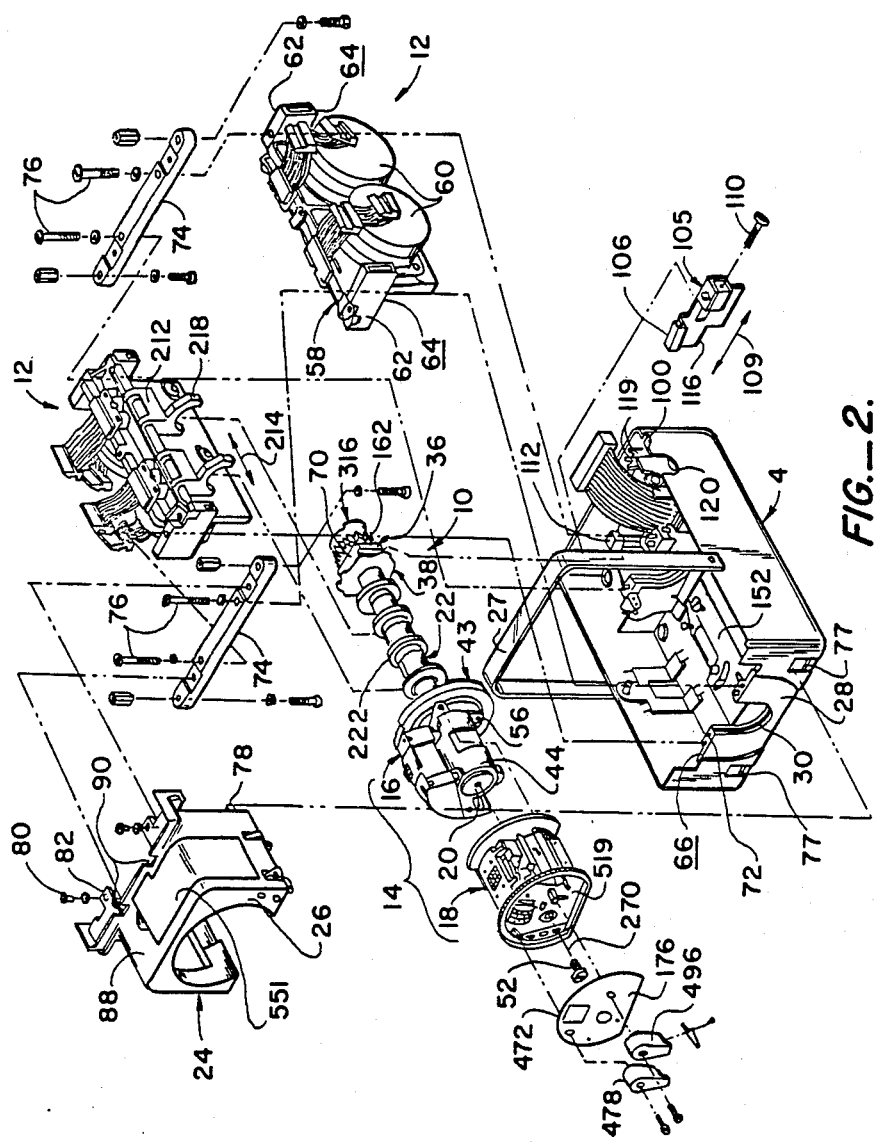
FIG._2.

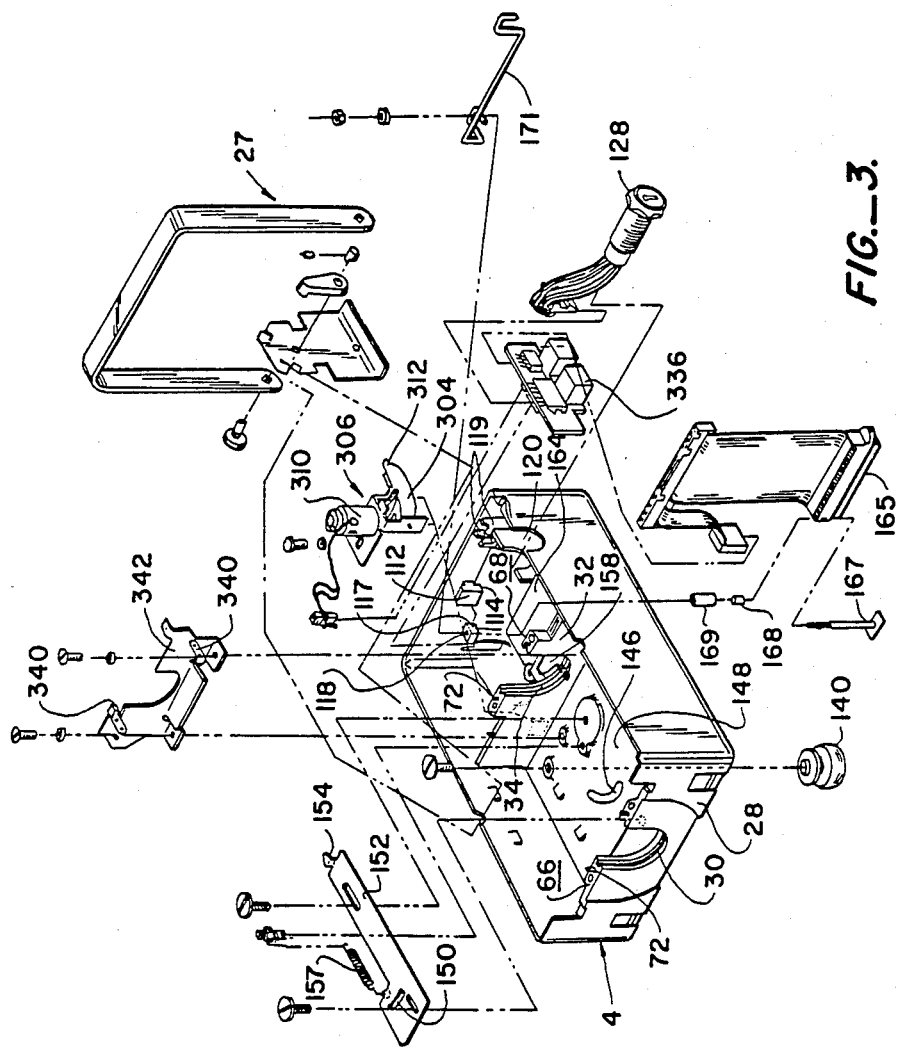

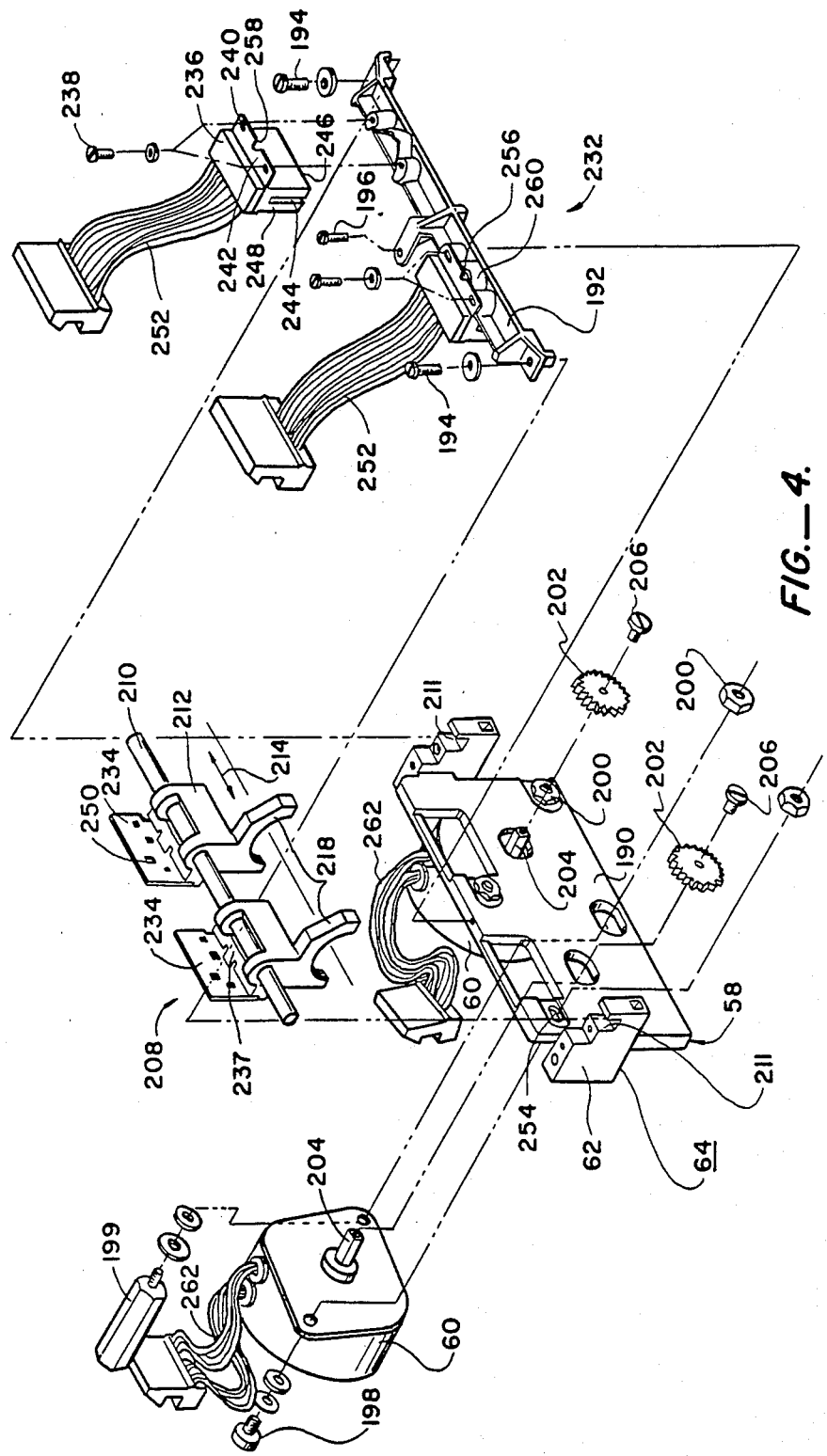
FIG.—4.

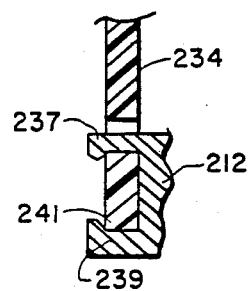
FIG._4B.
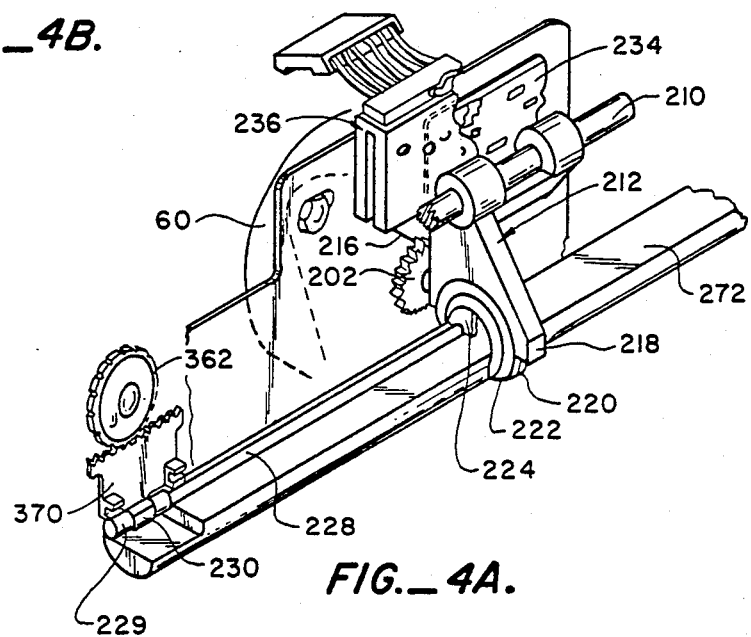
FIG._4A.

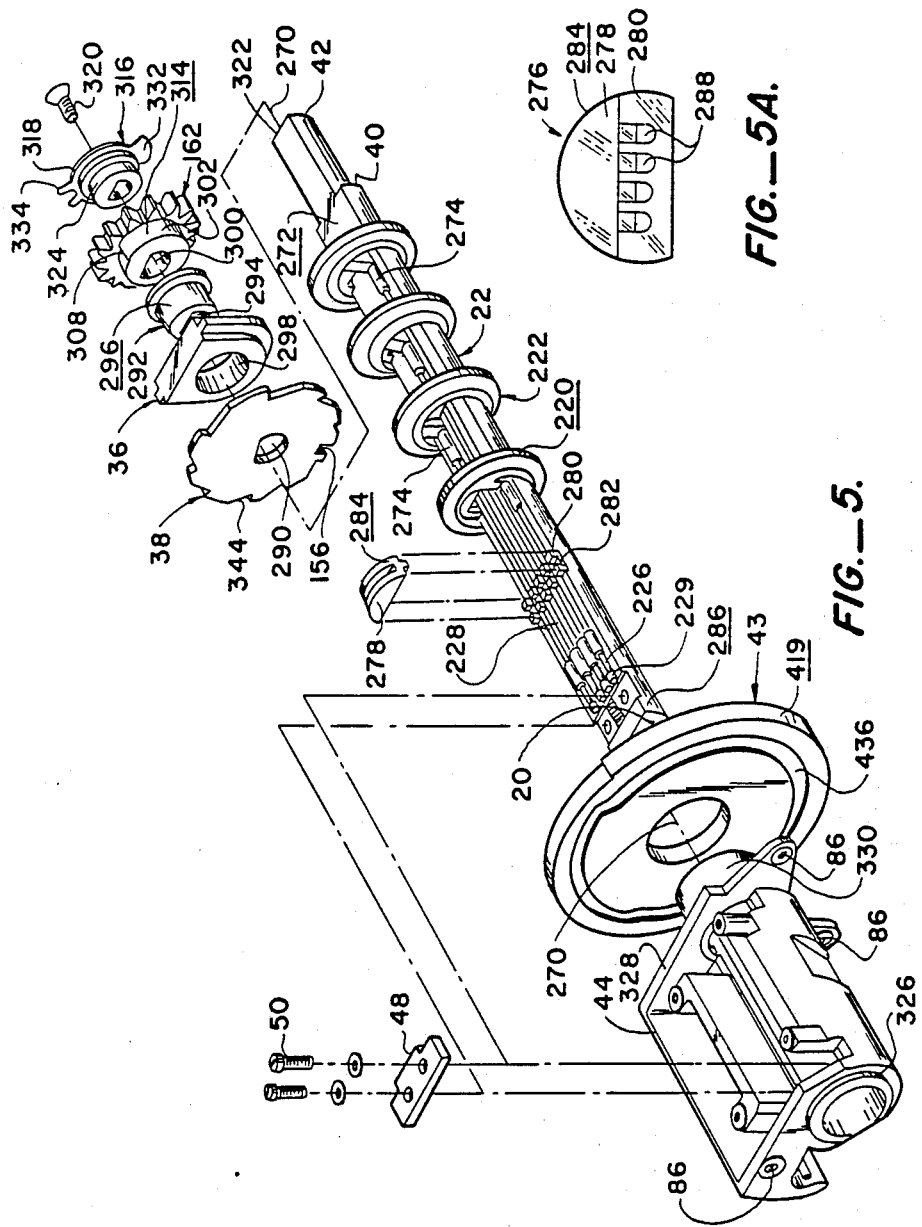

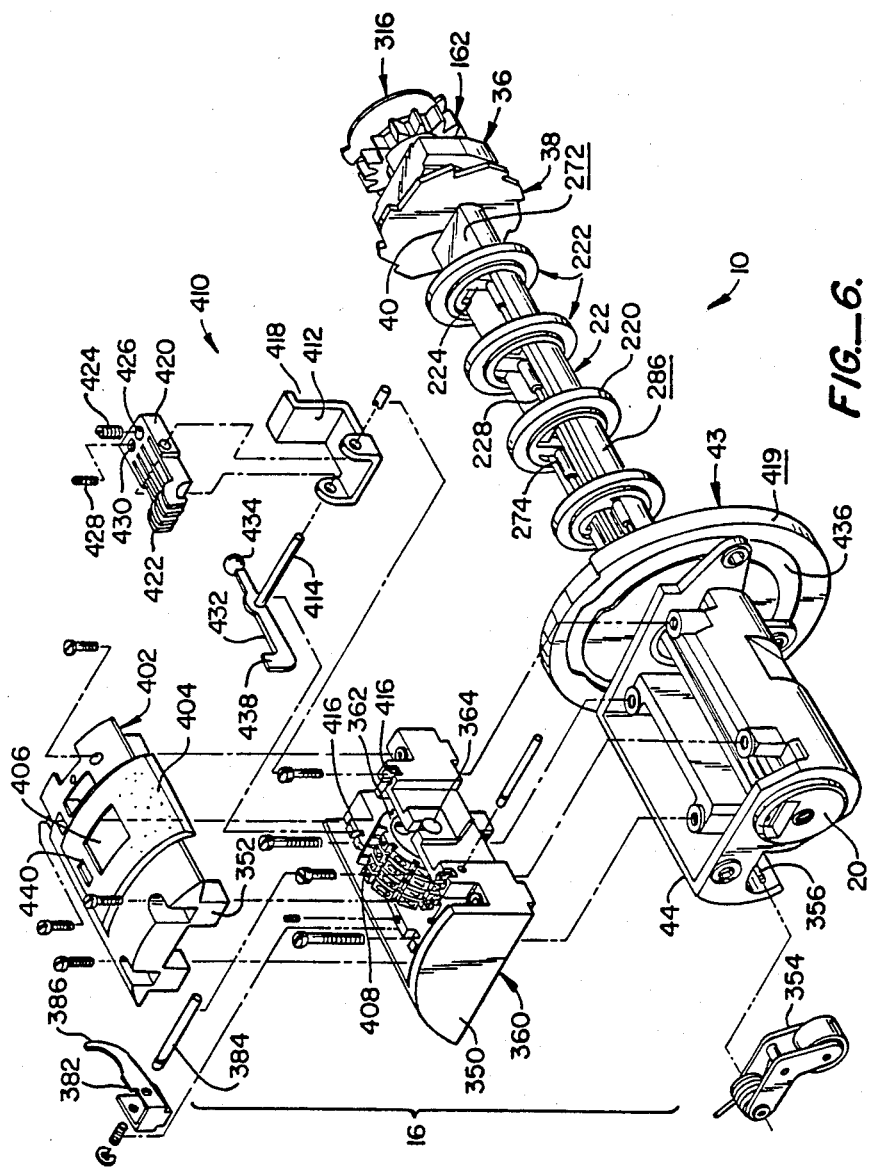
FIG._6.

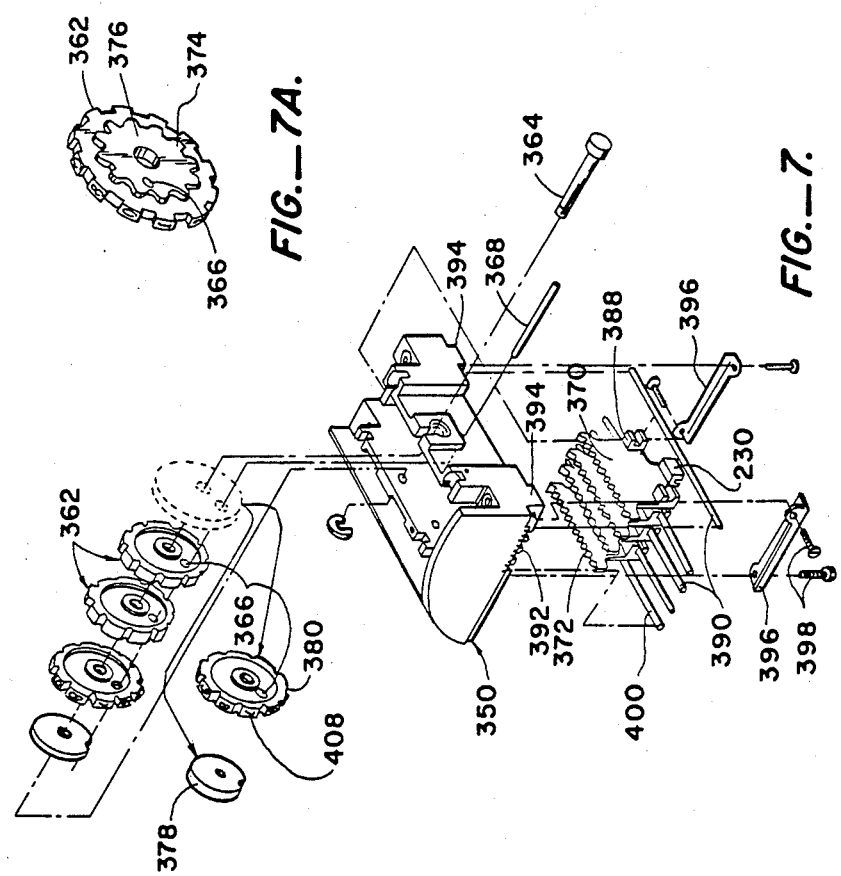

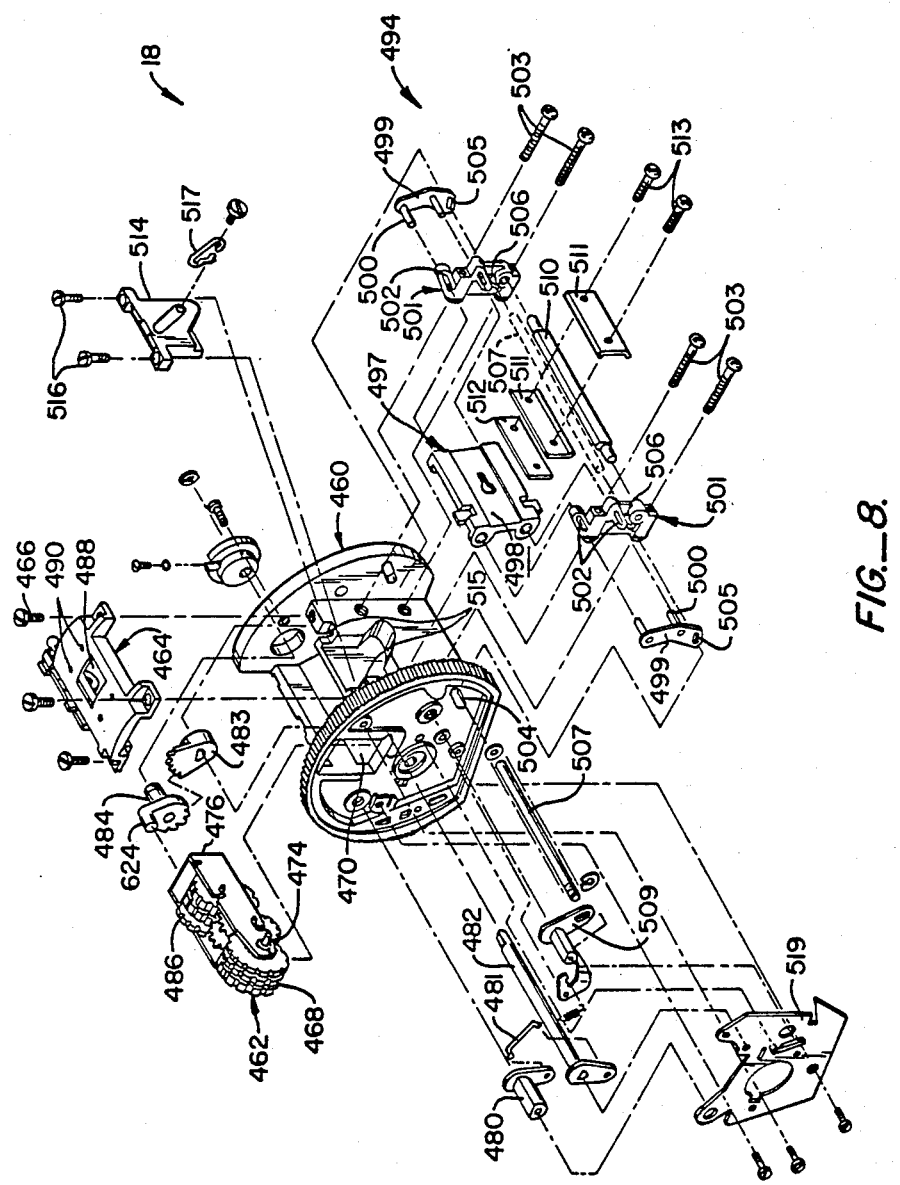
FIG._8.

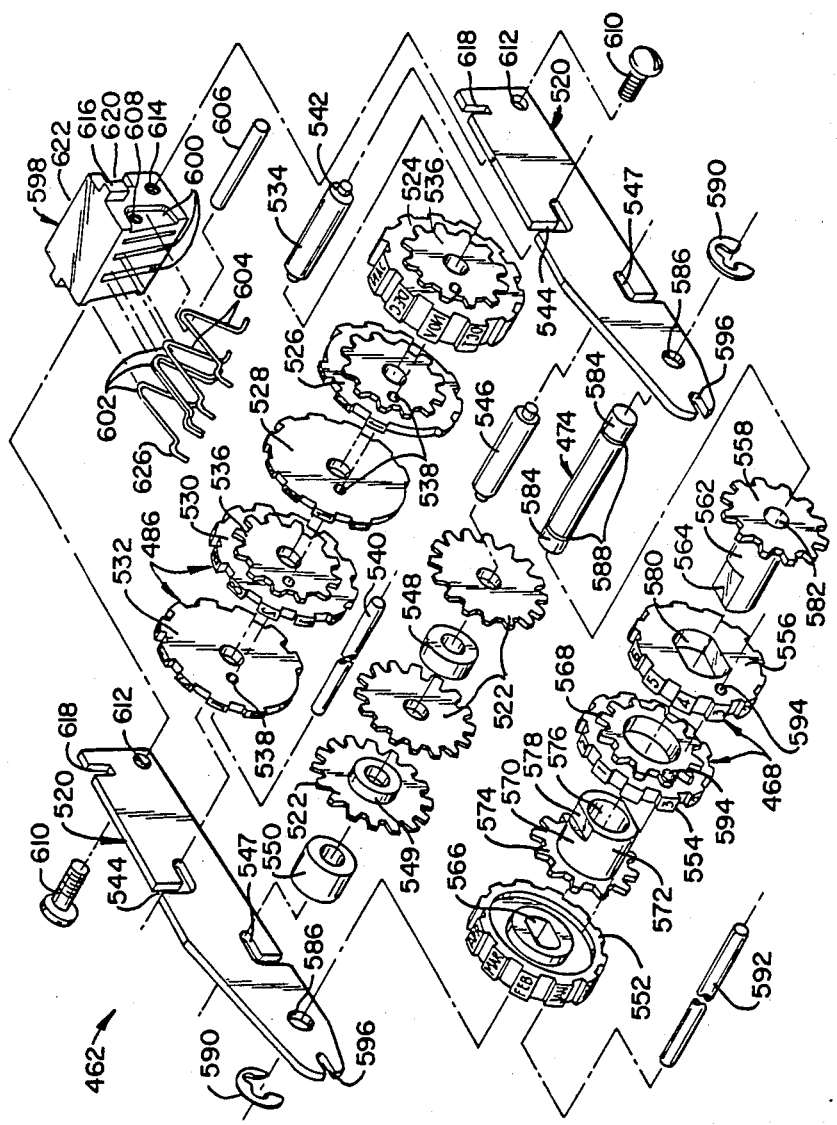
FIG._9.

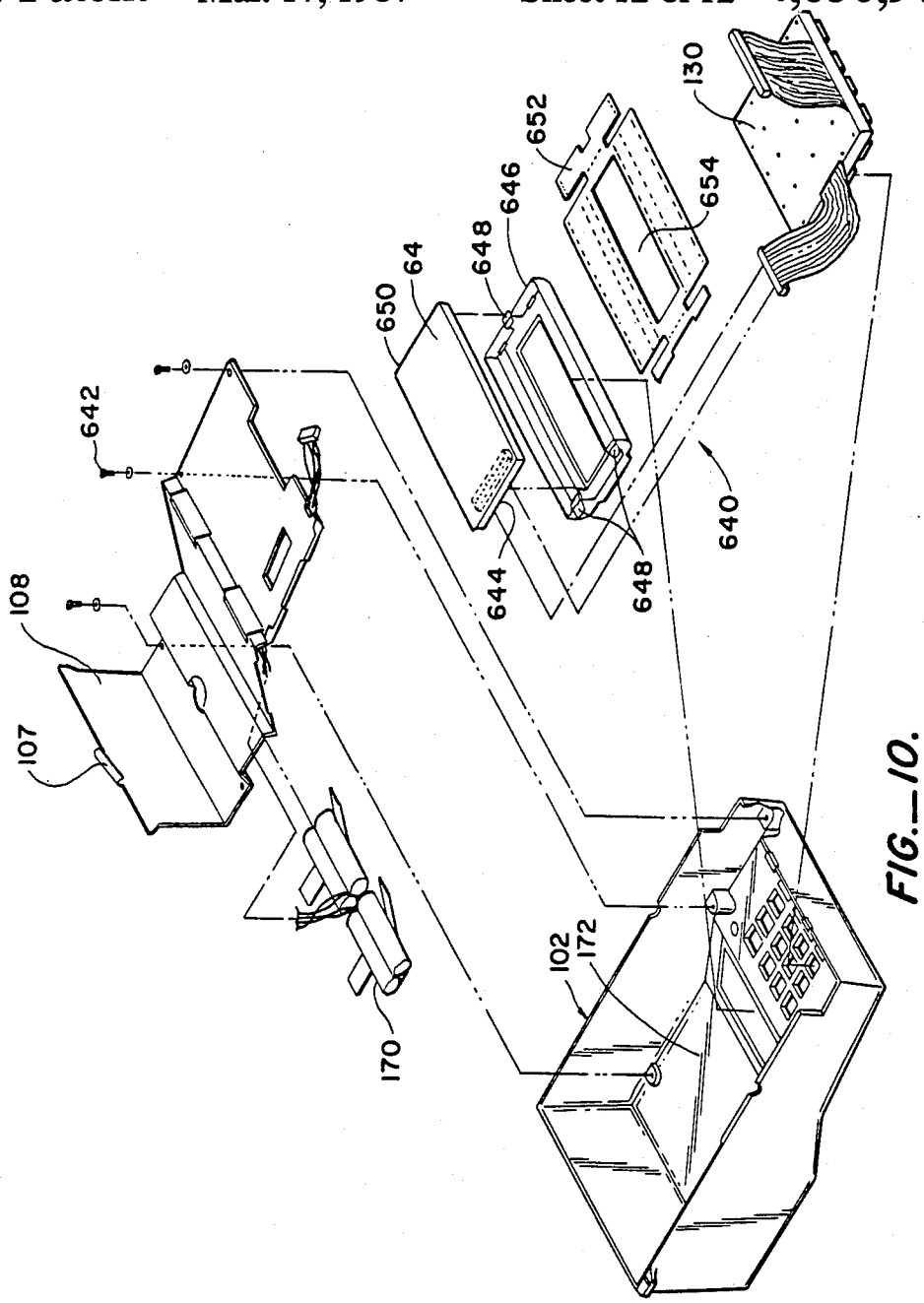
FIG._10.

POSTAGE METER COVER ASSEMBLY

BACKGROUND OF THE INVENTION

This invention relates to a metering product of the postage meter type. In particular it is directed to a modular, universal metering product. In this application the invention will be described with reference to a postage meter. However, the invention is broader and includes similar devices or machines which meter amounts by printing values.

Postage meters are used to dispense postage in lieu of postage stamps. They do so by printing the postage value directly on the letter or on a separate slip of paper which is secured to the letter or package by an adhesive. The printing surrounding the value is called the indicia. Postage meters are constructed with a descending register from which the amount of each postage value is subtracted after each print cycle. When the descending register reaches a value less than the next value to be metered, the meter will no longer function. To make the meter functionable again, the postage meter is brought to the post office where a desired amount of postage is added to the descending register of the meter by a post office employee. The meter is then sealed with a lead seal and is returned to the user. The postage meter is used to once again dispense postage for letters and packages.

Postage meters are generally used in conjunction with a separate postage meter base. The meter base includes the feed mechanism which drives letters between the rotating printhead of the postage meter and the meter base. The meter base usually supplies the source of power for the postage meter.

In the U.S., postage meters are leased, not sold, to better prevent unauthorized use or tampering with the meter. The meters are constructed with many anti-fraud devices and features to prevent improper use or tampering with the meter. The result has been that postage meters invariably must be returned to the manufacturer for virtually any type of servicing. Field servicing, even of parts not required to be maintained in a secure environment, is generally not possible. Although postage meters are generally quite reliable, when they must be returned to the factory for even minor repairs, the cost of the repair escalates.

Another problem present with many prior art postage meters is that once one part is removed, the entire meter must be realigned or readjusted. This is a time-consuming and thus costly process.

Postage meters are used in many different countries in lieu of postage stamps. Various parcel delivery services in a number of countries use delivery charge meters in their operations. These delivery charge meters are quite similar in construction and operation to postage meters. However, partly because of the anti-fraud and security requirements, many parts of the meters manufactured by the same company for different customers are not interchangeable. This increases the initial cost of the meter and also increases the cost of repair and maintenance due to increased inventory requirements.

SUMMARY OF THE INVENTION

The present invention is directed to a cover assembly for use with a postage meter or like apparatus. The cover assembly includes an upper cover having a display opening and a keypad opening formed therein. The upper cover is secured to a lower cover to provide a housing for the meter. A display assembly, including a character display, and keypad are both mounted to the inner surface of the upper cover. Portions of the keypad extends through the keypad opening for access by the user. The character display is visible through the display opening.

A support plate is mounted to the underside of the upper cover and is shaped to generally conform to the shape of the contents beneath the cover. The keypad and display assembly are captured between the support plate and the upper cover inner surface to keep the keypad and the display assembly in position.

A battery is used for the post office mode. That is, when the meter is removed from the source of power in the meter base and taken to the post office to add additional postage, the battery supplies the necessary power. The battery is preferably supported between the support plate and the upper cover.

The display assembly includes a display element, preferably a liquid crystal display element, secured to a printed circuit board, the combination being mounted to a display element cover. The portion of the display element cover overlying the character display of the display element is clear to permit the user to view the characters displayed while it protects the character display from damage. The display element cover preferably includes tabs for resiliently securing the display element cover to the display element and PC board.

The upper and lower covers are preferably hingedly mounted to one another at one end and secured at another at the opposite end using a factory personnel actuated slide latch. Such latch, secured to one of the upper and lower covers, includes an angled surface for engaging the complementary latching surface of a latching element secured to the other cover. The latch is preferably drawn into engagement with the latching member through a screw or like device. The screw is accessible to the assembler through an access opening, preferably in only one of the covers, using a non-standard tool. The access opening is normally blocked by a seal, such as a wire seal, to prevent unauthorized access to the meter.

Other features and advantages will appear from the following description in which the preferred embodiment has been set forth in detailed in conjunction with the accompanying drawings.

BRIEF DESCRIPTION OF THE DRAWINGS

FIG. 1 is a partially exploded isometric view of the modular universal postage meter with the mechanical components mounted in the base and the electronic components and cover shown in an exploded relationship.

FIG. 1A is an enlarged side view of the post office access opening and sealing ears.

FIG. 1B is a partial top plan view of a postage meter base, to which the postage meter mounts.

FIG. 1C is a partial cross-sectional view of a portion of the printhead cover assembly of FIG. 1 with the cover ajar.

FIG. 1 is an exploded isometric view of the mechanical components and base of the meter of FIG. 1.

FIG. 2A is an enlarged side view of the latch member of FIG. 2.

FIG. 3 is a further exploded isometric view of the components which remain mounted to the base in FIG. 2.

FIG. 4 is an exploded isometric view of a stepper motor module.

FIG. 4A is a perspective view of the components connecting to a stepper motor module the value module.

FIG. 4B is an enlarged partial cross-sectional view of the code bar mounted to the yoke.

FIG. 5 is an exploded isometric view of a main shaft assembly and the first part of the value base.

FIG. 5A is a side view of the rod guide and ink wiper.

FIG. 6 shows the main shaft assembly assembled and the value module in an exploded isometric view.

FIG. 7 is an exploded isometric view of the value module of FIG. 6.

FIG. 7A is a rear elevational view of a value print wheel.

FIG. 8 is an exploded isometric view of the dater/slogan module.

FIG. 9 is an exploded isometric view of the date wheels assembly of FIG. 8.

FIG. 10 is an inverted exploded isometric view of the cover assembly of FIG. 1.

DETAILED DESCRIPTION OF THE PREFERRED EMBODIMENT

Referring now to FIGS. 1, 1A, 1B and 2, applicant's modular universal postage meter 2, which of course can be used to print other values and indicia besides postage, includes broadly a base 4 and a cover assembly 6 housing electronic components 8, a shaft assembly 10 and two stepper motor modules 12. A separator sheet 13 is mounted between two of the component boards 15 carrying components 8. Electronic components 8 are described in detail in U.S. patent application Ser. No. 795,139, assigned to the assignee of this application, filed on Oct. 25, 1985, and entitled Improved Electronic Meter Circuitry, the disclosure of which is incorporated by reference. A printhead 14, including a value module 16 and a dater/slogan module 18, are mounted to the outer end 20 of a main or drive shaft 22. Printhead 14 is partially enclosed by a printhead cover assembly 24 which is open at its outer face 26 to permit access to dater/slogan module 18. A handle assembly 27 is secured to base 4 to allow meter 2 to be easily carried.

Base 4 acts as both the member to which stepper motor modules 12 and shaft assembly 10 are registered and secured and also acts as the lower housing for the meter. The outer end 28 of base 4 has a generally U-shaped bearing saddle 30 formed therein. A central vertically extending bulkhead 32 also has a generally U-shaped bearing saddle 34 formed in it. Shaft 22 has a D cross-sectional shape as shown in FIG. 5. Shaft assembly 10 has a bearing 36 supporting shaft 22 with an outer surface sized to fit within bearing saddle 34 of bulkhead 32. Bearing 36 is positioned axially along shaft 22 by being pressed against an anti-backlash plate 38 which itself presses against a shoulder 40 formed near an inner end 42 of shaft 22. A second bearing, not shown, is formed as an integral part of a combination member 43 and fits within bearing saddle 30. Thus, both bearing 36 and the bearing portion of member 43 position shaft 22 radially while a bearing race 292 and adjacent plate 38 positions the shaft axially relative to base 4.

A first part 44 of value module 16 is secured to shaft 22 by a plate 48 and screws 50. Dater/slogan module 18 is secured to outer end 20 of shaft 22 by a screw 52, which is a left hand screw. Alignment between value module 16 and dater/slogan module 18 is achieved by alignment of three pins, not shown, extending from the rear of a dater/slogan frame 460 of module 18 for engagement with complementary holes 56 provided in value module 16. Thus, printhead 14, including value module 16 and dater/slogan module 18, is mounted directly to shaft 22 which itself is mounted to and registered with base 4.

Stepper motor modules 12 both include a stepper motor frame 58 and a pair of stepper motors 60. A separate stepper motor 60 is used for each digit to be printed so that by using four stepper motors, values up to four digits in length can be printed. Stepper motor frames 58 each include a pair of mounting lugs 62 having generally horizontal lower surfaces 64 which rest against the upper surface 66 of outer end 28 (see FIG. 3) and the upper surface 68 of bulkhead 32, as well as the upper surface 70 of bearing 36 and the equivalent surface of the bearing portion of combination member 43. Stepper motor frames 58, and thus stepper motor modules 12, are aligned or registered with base 4 through the engagement of pins 72 extending upwardly from surfaces 66, 68 for engagement with complementary holes, not shown, in lower surfaces 64 of mounting lugs 62. Bars 74 and screws 76 are used to hold stepper motor modules 12 and thus bearings 36, 43 in place. Securing bearings 36, 43 in place thus secures shaft assembly 10 and printhead 14 in place as well.

Printhead cover assembly is hooked to outer end 28 of base 4 on pads 77 by a pair of L-shaped catches 78 at the lower portion of assembly 24. The upper portion of assembly 24 is secured to the front bar 74 by a pair of screws 80 passing through complementary holes in ears 82. Since cover assembly 6, when mounted to base 4, covers screws 80, the only way to remove printhead cover assembly 24 is to first remove cover assembly 6.

Assembly 6 is hooked at its front end 84 by a pair of generally L-shaped tabs 86 which engage under the top 88 of cover assembly 24 at points 90. The back end 92 of cover assembly 6 is then pivoted downwardly towards the back end 94 of base 4 until edge 96 of cover assembly 6 rests on edge 98 of base 4.

Cover 102 is secured to base 4 by a slidable cover latch 105. See FIGS. 2 and 2A. Latch 105 includes an angled latching member 106 which engages an angled tab 107 (see FIG. 10) extending from a support plate 108, support plate 108 being a part of cover assembly 6. Cover latch 105 is movably mounted to a lug 112 extending from base 4 for movement parallel to arrow 109 through rotation of draw screw 110. Cover latch 105 includes a generally L-shaped opening 113 for receipt of lug 112. Lug 112 has upper and lower lips 114 so when lug 112 is within the narrow portion 115 of opening 113, which occurs when cover latch 105 is drawn towards sealing ear 100 so to lock cover assembly 6 to base 4, cover latch 105 cannot be disengaged from lug 112. A lower edge 116 of cover latch 105 rests on a base pad 117 for stability. A screw 167, passing up through a threaded hole 118 in pad 117, helps keep cover latch 105 in position. The factory personnel access screw 110 by inserting a specially configured tool (having a necked-down shank) through a semicircular opening 111 in a sealing ear 100, described below. The head of draw screw 110 is captured between cradles 119 to restrict its axial movement so rotation of screw 110 moves cover latch 105 in the directions of arrow 109.

Base 4 also includes a U-shaped opening 120 normally covered by a post office door 122. Door 122 has a generally horizontal tab 124 which is normally engaged by wire 104. When wire 104 is removed, door 124 can be slid to the left in FIG. 1 until an opening 126 in door 122 is aligned with opening 120, thus permitting access by post office personnel to key lock 128. Key lock 128 is used to add or subtract money from the meter by post office personnel. Key lock 128 is turned and the keyboard 130 of cover assembly 6 is used to enter the amount of added postage. Once this is done, the key is rotated to its normal position, the key is removed, door 122 is closed and the meter is resealed with a new wire 104.

Base 4 includes sealing ear 100 which underlies a sealing ear 101 extending from the side of cover assembly 6. Sealing ears 100, 101 along with a hole 124 in door 122 define a vertical bore 103 through which a sealing wire 104 is passed when the meter is sealed.

Meter 2 is used with a postage meter base 134, see FIG. 1B. Base 134 includes a mounting platen 136 containing four openings 138 within which legs 140, see FIG. 3, extend. Base 134 includes a locking lever 142 which when moved from the right hand position of FIG. 1B to the left, both unlocks legs 140 from base 134 and also moves a pin 144, which extends upwardly from plate 136 through slot 146 in the bottom 148 of base 4, to engage a slot 150 in a bar 152 slidably mounted to bottom 148. Bar 152 is thus slid to the right in FIGS. 2 and 3 by pin 144 so that its tip 154 engages the home position slot 156 in anti-backlash plate 38 (see FIG. 5). Meter 2 cannot be removed from base 134 if tip 154 does not engage slot 156. Only when locking lever 142 is moved to the left in FIG. 1B, thus locking legs 140, will pin 144 move to the position of FIG. 1B moving bar 152 to the left in FIGS. 2 and 3 thus disengaging tip 154 from slot 156. Spring 157 retains bar 152 in its rightward position when meter 2 is removed from base 134. Thus, whenever meter 2 is removed from postage meter base 134, the mechanisms are locked in the home positions by tip 154 within slot 156.

Bottom 148 includes a gear slot 158, see FIG. 3, through which a main driving gear 160, see FIG. 1B, extends to engage a drive gear 162 secured to shaft 22. An electrical connector opening 164, for the electrical connection between a connector 165 (see FIG. 3) in meter 2 and an electrical connector 166 on base 134 is also provided in bottom 148. Connector 165 is spring mounted to base 4 by screws 167 (only one of which is shown in FIG. 3), springs 168 and spacers 169, the screws 167 engaging threaded holes 118 in pads 117. This spring mounting allows connector 165 to float so to accommodate tolerance build-up in meter 2 and meter base 134. A wire form cable guard 171 is used to keep various wires and cables in base 4 in place.

In use, the user first brings meter 2 to the post office for addition of postage. A post office employee removes wire seal 104 and post office door 122 is slid to the left to expose key lock 128. Key lock 128 is momentarily turned and released and then the appropriate amount of postage is entered through keypad 130. After this is done, the key is turned back to its off position to allow the key to be removed. Post office door 122 is slid back to the right covering opening 120 and a wire seal 104 is fastened through vertical bore 103 in sealing ears 100, 101 and tab 124. No separate supply of energy need be used during these operations because of the use of batteries 170 mounted between the underside 172 of cover 102 and support plate 108, shown in FIG. 10. Meter 2 is then mounted to postage meter base 134, which may be of several different types. Locking lever 142 is moved to its locking position thus securing legs 140 in place and moving bar 152 away from plate 34. Upon demand for a print cycle, meter base 134 causes main driving gear 160 to rotate sufficiently to rotate shaft assembly 10 one complete revolution.

If desired, the field service technician can remove dater/slogan module 18 by removing screw 52. After removal of screw 52, dater/slogan module 18 is simply withdrawn through the opening in outer face 26 of printhead cover assembly 24 for cleaning, maintenance or replacement of the town circle and slogan plates. If work needs to be done on either of the stepper modules 12, either can be removed by factory representatives without disturbing the balance of the meter. In many cases, the stepper motor module 12 can be replaced with minimal adjustments necessary.

The above constitutes the broad aspect of the invention. The other aspects of the invention are described in detail below.

Stepper Motor Module

Referring now to FIG. 4, stepper module 12 is shown. Stepper motor frame 58 includes a main frame portion 190, from which mounting lugs 62 extend along either side, and an upper frame portion 192, secured to main frame portion 190 by screws 194, 196. Stepper motors 60 are secured to main frame portion 190 by screws 198, 199 and nuts 200. Screw 199 has an extended length head to permit manipulation of screw 199 while stepper motor module 12 is mounted within base 4. A stepper motor gear 202 is secured to the shaft 204 of each stepper motor 60 by screws 206.

Stepper motor modules 12 each include a yoke assembly 208 including a yoke guide shaft 210, the ends of which are secured within openings 211 of mounting lugs 62 by upper frame portion 192. A pair of yokes 212 are slidably mounted to the yoke guide shaft 210 for movement along a yoke path parallel to arrow 214 of FIG. 4. Yokes 212 include a rack 216, shown in FIG. 4A, which engages an underlying stepper motor gear 202. Thus, as stepper motor 60 rotates stepper motor gear 202, yoke 212 moves parallel to arrow 214. Yokes 212 also include a grooved arcuate portion 218 shaped to engage the circular periphery 220 of coupler rings 222. Coupler rings are open at the center so to fit over shaft 22 and include an inwardly extending clip 224, the distal end of which is sized to clip onto a reduced diameter portion 226 of a value rod 228. Value rods 228 also include reduced diameter portions 226 adjacent their outer ends 229 to which similar rod clips 230 are secured for actuation of the value module 16 of printhead 14. This is discussed in the Value Module section below.

An indication of the axial position of yokes 212, and thus of value rods 228, is provided by a position indicator 232. Indicator 232 includes a code bar 234 mounted to yoke 212. As shown in FIG. 4B, code bar 234 includes a mounting aperture 235 formed centrally therethrough for receipt of a mounting clip 237 extending from yoke 212. Yoke 212 also includes a support ledge 239 upon which the bottom edge 241 of code bar 234 rests. This mounting configuration is simple and inexpensive and allows the specific pattern of the opening 250 in code bar 234 to be varied without affecting the design of yoke 212.

A sensing unit 236 is mounted to upper frame portion 192 by screws 238 extending through slotted openings 240 in a lip 242 extending from sensing unit 236. Sensing unit 236 includes a central slot 244 sized to house code bars 234 and allow free movement of the code bars as yokes 212 move parallel to arrow 214. One leg 246 of sensing unit 236 houses an array of five light emitting diodes, not shown, while the other leg 248 contains an array of light sensors, not shown, the light emitting diodes and light sensors positioned opposite one another and pointing inwardly toward slot 244. Openings 250 in code bar 234 are positioned in a chosen pattern so as to produce a number of different signals along signal lines 252 according to the relative positions of movable code bar 234 and stationary sensing unit 236. In the preferred embodiment, position indicator 232 indicates 10 whole positions and 11 half positions, the 10 whole positions representing numerals 0-9 with the 11 half positions representing positions physically to one side of the whole positions. Preferably this output is provided to electronic components 8 in a hexidecimal coded output. The use of both the whole positions and the intermediate positions is important since it permits more accurate and faster operation of stepper motors 60.

The position of stepper motor frame 58 relative to base 4 is fixed by pins 72 engaging complementary holes along lower surface 64 of mounting lug 62. Some adjustment of stepper motor 60 is permitted by the use of slotted openings 254 in main frame portion 190. Positional adjustment of sensing units 236 is achieved in a simple, yet quite accurate manner. Slotted openings 240 permit some movement parallel to arrow 214. Final adjustments are made by partially tightening screws 238 and then inserting the flat blade of a screw driver into the opening 256 defined between a V-slot 258 formed in lip 242 and an adjacent abutment member 260 of upper frame portion 192. This arrangement permits accurate positional adjustment of sensing units 236 simply and quickly.

In use, stepper motor modules are mounted to base 4 at a fixed position through pins 72 and secured in place by bars 74. Minor positional adjustments of yokes 212 is achieved by moving stepper motor 60 slightly through the mainpulation of mounting screws 198, 199. Final positional adjustments of sensing units 236 are made by backing off screws 238 slightly and moving sensing units 236 through the insertion of an object, such as the tip of a screw driver, into opening 256 and then retightening screws 238. Stepper motors 60 are actuated by electronic components 8 through lines 262 to rotate gears 202 to drive racks 216 thus moving yokes 212 parallel to arrow 214.

Stepper motor 60 is conventional and is made so shaft 204 rotates in 7½° increments. In lieu of rotary stepper motor 60, a linear stepper motor could be used if desired. By proper sizing such a linear stepper motor could be used to drive yokes 212 directly.

The preferred embodiment uses a separate stepper motor 60 for each value rod 228. It is possible to use a single motor drive for all value rods 228. However, such an arrangement would require some sort of transmission mechanism to shift the single motor drive to the various value rods. Presently the use of separate rotary stepper motors 60 for each value rod is preferred for simplicity in design, ease of initial adjustment and maintenance and the ability to make the components modular. It is possible to use analogue motor drives which have continuous positional outputs, rather than the discrete positional outputs of stepper motors. In light of the widespread use of digital controls to drive stepper motors, stepper motors are presently preferred. However, the term stepper motor in this application is used for ease of recognition and includes continuous position motor drives as well.

Shaft Assembly

Referring now to FIGS. 2, 5, 5A and 6, shaft assembly 10 includes shaft 22 to which four value rods 228 are mounted parallel to the longitudinal axis 270 of shaft 22 and adjacent flat surface 272 of shaft 22. Value rods 228 are of different lengths corresponding to the axial positions of yokes 212. Coupler rings 220 thus position the inner ends 224 of value rods 228. A rod guide and ink wiper 276 includes upper and lower parts 278, 280 and is mounted to a slot 282 formed in surface 272 of shaft 22. The outer surface 284 of rod guide and ink wiper 276 has the same radius of curvature as arcuate surface 286 of shaft 22. Lower part 280 has a number of generally U-shaped openings 288 for receipt of value rods 228. Rod guide and ink wiper 276 both positions and guides value rods 228 and also helps to keep ink, which may get on the portions of value rods 228 within printhead 14, from migrating along the value rods towards the inner ends 274 of value rods 228.

Anti-backlash plate 38 has a D-shaped opening 290 sized to fit on reduced diameter inner end 42 of shaft 22. Bearing 36 fits over bearing race 292. Race 292 has a D-shaped opening 294 for mounting over end 42 and a circular outer surface 296 for mounting within a circular bore 298 of bearing 36. Driven gear 162 includes a D-shaped opening 300, sized to fit over end 42 for driven engagement therewith, and an integral shoulder stop 302. Stop 302 is normally engaged by a pawl 304 (see FIG. 3) of a solenoid actuated rotation stop 306. Pawl 304 is spring biased to engage a shoulder 308 of stop 302 and thus prevent gear 162 from rotating in a counterclockwise direction as viewed in FIG. 5. However, upon actuation of main driving gear 160, a solenoid 310 of stop 306 is momentarily actuated lifting the distal end 312 of pawl 304 momentarily, thus permitting rotation of drive gear 162. Solenoid 310 is deactuated sufficiently quickly so that distal end 312 rides along the outer surface 314 of shoulder stop 302 so to engage shoulder 308 to prevent more than one revolution of drive gear 162.

The last member mounted to end 42 of shaft 22 is a home position flag member 316. Member 316 includes a disc-like outer portion 318 having a relatively small diameter hole, not shown, formed through its middle for the passage of the shank of a screw 320 which engages a complementary threaded hole, not shown, at an inner face 322 of shaft 22. Member 316 also includes a spacer shoulder 324 sized so that when screw 320 is tightened against outer portion 318, shoulder 324 presses against drive gear 162, which presses against adapter bearing race 292. Race 292 is slightly longer than bearing 36 so race 292 presses against anti-backlash plate 38 forcing it against shoulder 40. In this manner, the axial positions of anti-backlash plate 38, drive gear 162 and especially bearing 36 with respect to shoulder 40 are fixed.

Outer end 20 of shaft 22 is rotatably supported within a bushing 326 mounted within first part 44 of value base 46. Bushing 326 extends past an inner end 328 of first part 44 and through combination cam race and support bearing 43. Note that slot 282 in shaft 22 is positioned so that rod guide and ink wiper 276 is housed within the inner end 330 of bushing 326. The bearing portion of combination 43 is not shown, but is similar to bearing 36 and mounts within bearing saddle 30 of outer end 28 of base 4. Thus, the radial position of shaft assembly 10 is determined by bearing 36 and combination 43 mounted to bearing saddles 30 and 34. The axial position of shaft assembly 10 is determined by the axial position of bearing 36; the axial position can be quite accurately controlled by controlling the thickness of anti-backup plate 38 and the position of shoulder 40.

The above-described arrangement aids the accurate axial positioning of the various members and aids the construction and disassembly of shaft assembly 10. Everything simply slides over inner end 42 and is fastened into place. This is made possible by the fact that the size of end 42 of shaft 22 is not larger than the portion of shaft 22 along which value rods 228 move. The D cross-sectional shape of shaft 22 also simplifies the driving interface between shaft 22 and plate 38, gear 162 and member 316.

Home position flag member 316 includes a solid ear 332 and a split ear 334 extending from outer portion 318 which pass a home position sensor 336, preferably an electro-optical device, coupled to electronic components 8. Shaft assembly 10 is in the home position when home position slot 156 is at its bottom dead center position as shown in FIG. 5 and ears 332, 334 are generally horizontal. When in the home position, solid ear 332 is aligned with home position sensor 336. This information is used by electronic components 8 to validate that another print cycle can commence.

A pair of anti-backlash pawls 340 (see FIG. 3) are mounted to a support frame 342 which itself is secured to base 4. Pawls 340 are in the preferred embodiment leaf springs biased to engage the notched periphery 344 of anti-backlash plate 38. Using a pair of pawls 340 helps ensure that shaft assembly 10 cannot be rotated in reverse, that is clockwise in FIG. 5, without destroying the meter.

Coupler rings 222 have a continuous, circular periphery 220 so to constantly engage yokes 212. Although not recommended, coupler rings 222 could be configured so that the rings engage yokes 212 while shaft assembly is in its home position but not otherwise. Although surface 272 is coplanar along the entire length of shaft 22, this is not necessary. For example, the portion of surface 272 at inner end 42 could be positioned closer to axis 270 then the remainder of surface 272. If desired inner end 42 could be cylindrical (or some other shape) so long as it is sized to allow coupler rings 222 to slide over end 42. However, the simplicity of manufacture and the advantages of the positive drive achievable using the disclosed D cross-sectional shape drive shaft 22 make its use generally preferred.

Value Module

Referring now to FIGS. 6 and 7, value module 16 is shown to include value base 46 comprising first part 44 a second, intermediate value module base port 350 and a third, upper value module base part 352. As discussed above, first part 44 is secured to outer end 20 of shaft 22 by a plate 48 and screws 50 as illustrated in FIG. 5. Thus, value module 16 rotates together with shaft 22. A conventional spring biased roller mechanism 354 is pivotally mounted to a pin 356 extending from first part 44. Roller mechanism 354 engages letters or other item passing between printhead 14 and a drive base 358 of postage meter base 134 shown in FIG. 1B.

Second base part 350 constitutes part of a value assembly 360 which includes a number of value print wheels 362 rotatably mounted to intermediate base part 350 by a pin 364. Value print wheels 362 each have an alignment hole 366 for receipt of an alignment shaft 368 during initial set up only. Value assembly 360 also includes a number of racks 370 having teeth 372 which engage complementary teeth 374 of a gear 376 integrally formed with value print wheels 362, and, shown in FIG. 7A. In the preferred embodiment, shown in FIG. 6, four value print wheels 362 are illustrated. In the embodiment of FIG. 7 a spacer wheel 378 is shown for substitution of the higher most value print wheel 380 when only three digits are desired. Also included in value assembly 360 is a decimal point arm 382 pivotally attached to second base part 350 by a pivot pin 384. Tip 386 of decimal point arm 382 is positioned where needed. For U.S. postage meters, arm 382 is positioned so that there would be two digits to the right of the decimal place.

Racks 370 each include a pair of sideways extending U-shaped guides 388 which slidably engage horizontally positioned rack guide rods 390. Rods 390 are secured within downwardly opening slots 392 formed in downwardly extending lugs 394 of second base part 350. Rods 390 are secured within slots 392 by a pair of elongate, L-shaped keepers 396 which are mounted to lugs by screws 398. An extra rod 400 is used to keep the left hand most rack 370, as shown in FIG. 7, from disengaging from its associated rack guide rod 390. For simplicity, alignment shaft 368 is identical to rack guide rods 390 so that no extra parts is needed to align value print wheels 362.

Racks 370 also include, as discussed above with reference to FIG. 4A, downwardly extending rod clips 230 which engage reduced diameter portions 226 of value rods 228 at the outer ends 229 of the value rods. Movement of value rods 228 drove racks 370 along guide rods 390; this rotates value print wheels to the appropriate positions.

Third base part 352 constitutes a part of an indicium assembly 402. Assembly 402 also includes an indicium plate 404 mounted to third base part 352. Plate 404 has an opening 406 through which value printing characters 408 partially extend. Therefore, any embossed portions of indicium plate 404 and the embossed characters 408, typically numerals, are printed during a print cycle.

A value print wheels lock 410 is mounted to second base part 350 and between the second and third base parts 350, 352. Lock 410 includes a generally Z-shaped cam member 412 pivotally mounted by a pivot pin 414 to second base part 350, the ends of pin 414 being housed within saddles 416 formed within second base part 350. Cam member 412 includes a cam lip 418 which overlies and engages a value print wheel cam surface 419 of combination cam plate and bearing 43. Lock 410 also includes a pawl assembly 420 including a pawl 422 for each value print wheel 362. Pawl assembly 420 is also pivotally mounted to pivot pin 414. Pawls 422 are positioned so that they may engage or disengage teeth 374 of gears 376 associatd with each value print wheel 362.

A coil spring 424 is mounted within a depression 426 in pawl assembly 420. The upper end of spring 424 presses against an overlying portion of third base part 352; this biases pawls 422 up and away from teeth 374. Spring 424 also causes pawl assembly 420 to press against cam member 412 thus biasing cam lip 418 against cam surface 419. An adjustment screw 428 engages a threaded through hole 430 in pawl assembly 420; the end of screw 428 passes through pawl assembly 420 to rest against cam member 412. Movement of adjustment screw 428 varies the point along cam surface 419 at which cam lip 418 has moved sufficiently to cause pawls 422 to engage and disengage teeth 374. In the preferred embodiment, cam surface 420 is formed so that pawls 422 engage gear teeth 374 starting about 20° to 30° after the start of a print cycle and remain engaged, thus prevening any rotation of value print wheels 362 for about the next 180° of the print cycle, after which pawls 422 once again disengage gears 376.

Also mounted to pivot pin 414 is an anti-fraud bar 432. Bar 432 has a spherical end 434 which engages an anti-fraud cam track 436 formed in combination cam race and bearing 43. Bar 432 also includes an outwardly extending tip 438 sized to extend through an anti-fraud opening 440 in indicium plate 404. Cam track 436 is configured so that tip 438 extends outwardly past the outer surface of indicium plate 404 towards an inner surface of printhead cover assembly 24 throughout the print cycle except when it passes the inking and printing stations. This effectively blocks any attempt to create a rubbed impression by the user trying to force something, such as an envelope, past the value printing characters 408 presented at opening 406 while in the home position.

In use, in response to the input of the desired value amount, typically through keypad 130, stepper motor modules 12 move value rods 228 to the appropriate axial positions; this moves racks 370 to corresponding axial positions. Teeth 372 of racks 370 drive teeth 374 of gears 376 thus rotating value print wheels 362. Thereafter, main driving gear 160 rotates shaft assembly 10 through drive gear 162 thus rotating printhead 14 and value module 16 therewith. During the beginning portion of the print cycle, cam lip 418 is biased outwardly by cam surface 419 locking value print wheels 362 in place; tip 438 of anti-fraud bar 432 is drawn back through anti-fraud opening 440 during the actual inking and printing portions of the print cycle. Pawls 422 are disengaged from teeth 374 just after printing and remain disengaged throughout the remainder of the print cycle.

Dater/Slogan Module

Referring now to FIG. 8, an exploded isometric view of dater/slogan module 18 is shown. Module 18 includes a dater/slogan frame 460 to which a date wheels assembly 462 and a town circle mount 464 are mounted. Mount 464 is rigidly attached to frame 460 by screws 466. Date wheels assembly 462 is mounted to frame 460 so that date select wheels 468 are presented to the user through opening 470, 472 in frame 460 and cover plate 176 (FIG. 2) respectively.

Assembly 462 is mounted so that it pivots about a date select wheels mounting pin 474; this allows an inner end 476 of assembly 462 to move radially or vertically inwardly and outwardly with respect to axis 270. This is accomplished by movement of a handle 478 which is operbly connected to end 476 by a number of linkage members 480-484. Thus, movement of handle 478 allows the outermost portions of date print wheels 486 to move vertically inwardly and outwardly through an opening 488 in town circle mount 464. With this arrangement the user can select the date by manipulating the date select wheels 468, which are presented through opening 472 in cover plate 176, and can retract date print wheels 486 when no date is desired to be printed.

The appropriate town circle, not shown, is secured to town circle mount 464 using threaded holes 490.

A slogan plate mounting assembly 494 is mounted to frame 460 for movement between a radially extended, printing position and a radially retracted, nonprinting position by a handle 496 (see FIG. 2). Assembly 494 includes a slogan plate base 497 having an outer surface 498 to which a slogan plate, not shown, is secured. Plate 497 is mounted between a pair of side plates 499 by pairs of pins 500 extending from side plates 499. Interposed between side plates 499 and slogan plate base 497 are couplers 501 having slots 502 for engagement of pins 500 therein. Couplers 501 are secured to frame 460 by screws 503. Frame 460, side plates 499 and couplers 501 each have respective slots 504, 505, 506 for passage of an actuator rod 507 therethrough. One end 508 of actuator rod 507 is connected to handle 496 by linkage 509. A square crosssection rod 510 is mounted between couplers 501. Rods 507, 510 are secured to one another by clamp plates 511, 512 and screws 513. This arrangement causes clamped rods 507, 510 to act as an eccentric to either place outer surface 498 in a radially extended, printing position or a retracted, nonprinting position by actuating handle 496.

Linkage members 480, 482 and 507 are held in place by a plate 519. An additional information slug holder 514, used to hold informational slugs (not shown) with messages such as First Class or Non-Profit, is secured to frame 460 at positions 515 by screws 516. Holder 514 includes a wire form spring detent 517 used to secure the additional information slug plate in place.

Turning now also to FIG. 9, date wheels assembly 462 is seen to include a pair of side plates 520 between which date select wheels 468, date print wheels 486 and idler gears 522 are mounted. Date print wheels 486 include a month print wheel 524, day of the month print wheels 526, 528 and year print wheels 530, 532, all mounted to a date print wheel shaft 534. Date print wheels 526-532 each have integral date print wheel gears 536 and alignment holes 538, for the temporary receipt of an alignment pin 540, such as when first assembled. Shaft 534 has reduced diameter ends 542 sized to fit within an L-shaped slot 544 formed in each side plate 520. During assembly the outer ends of alignment pin 540 also pass into slots 544 for the proper alignment of date print wheels 486.

Idler gears 522 are mounted to an idler gear shaft 546 similar to shaft 534. Each idler gear 522 includes an integrally formed hub 549. The reduced diameter ends of shaft 546 are mounted within L-shaped slots 547 in side plates 520. Appropriate spacers 548 and 550 are mounted between idler gears 522 so gears 522 engage date print wheel gears 536 of month and day of the month print wheels 524, 526 and 528. No idler gears are necessary for year print wheels 530, 532; since these are set only yearly, these can be set by the user by moving year print wheels 530, 532 through an opening provided under a printhead door 551 (FIGS. 1 and 2).

Date select wheels 468 include a month select wheel 552 and day of the month select wheels 554, 556. Month select wheel 552 drives a month select gear 558 through a hollow extension 562 of gear 558; extension 562 has a driven end 564 shaped for complementary mating driven engagement with a bore 566 in month select wheel 552. Day of the month select wheel 554 has an integrally formed gear 568 for direct engagement with the middle of idler gears 522. Select wheel 554 is mounted over the cylindrical portion 570 of a hollow extension 572 of a select gear 574. Hollow extension 562 rotatably engages the cylindrical interior 576 of extension 572. The far end 578 of extension 572 is shaped for driven engagement with the interior 580 of day of the month select wheel 556. Pin 474 is rotatably housed within a bore 582 within gear 558 and its extension 562. The ends 584 of pin 474 pass through circular openings 586 in side plates 520 and have grooves 588 to which clips 590 attach to secure pin 474 in place. During initial assembly, an alignment pin 592 is inserted through alignment holes 594 in date select wheels 486, the ends of pin 592 being guided within end slots 596 of plates 520.

A detent spring mounting block 598 has a number of detent spring openings 600 formed therein and in which the apexes 602 of bent wire detent springs 604 are mounted. A pin 606 passes through a through bore 608 in block 598 to engage springs 604 adjacent their apexes 602 thus keeping the springs mounted to the block. Block 598 with the springs 604 secured thereto is mounted between plates 520 with mounting screws 610 passing through holes 612 in plates 520 and engaging threaded bores 614 in block 598. Ears 616 fit within slots 618 formed within plate 520 to keep block 598 aligned. Block 598 also includes a recessed region 620 formed along its back side 622 for engagement of the outwardly extending pin 624 of linkage member 484. The outer ends 626 of springs 604 are shaped to engage gears 536 to act as detent mechanisms to keep date print wheels 486 from rotating freely and to properly position the date print wheels for good, clean impressions during printing. Block 598 and springs 604 combine to provide an elegantly simple and uncomplicated detent mechanism for date wheels assembly 462.

Date wheels assembly 462 is simple in construction and lends itself to easy, almost full-proof assembly. One method of assembly proceeds as follows. Springs 604 are first mounted within the various spring openings 600 and are secured by pin 606. Block 598 is then secured between plates 520 by screws 610. Date print wheels 486 are mounted to print wheel shaft 534 and the date print wheels are aligned or timed by passing alignment pin 540 through alignment holes 538. Reduced diameter ends 542 of date print wheel shaft 534 are inserted within slots 544. The ends of alignment pin 545 are then inserted into slots 544 to ensure the proper rotary orientations of date print wheel 486. Idler gears 522 and spacers 548 and 550 are mounted to alignment gear shaft 546, the ends of which are passed through second L-shaped slot 547 and into engagement with gears 536. Date select wheels 468 and associated gears are first mounted to one another; next they are placed between plates 520 to allow mounting pin 474 to be passed through openings 586 of side plates 520 and bore 582 of month select gear 558 and its associated hollow extension 562. The proper alignment of date select wheels 468 is ensured by the engagement of alignment pin 582 through alignment holes 594 and within end slots 596. Clips 590 keep pin 474 in place. Alignment pins 540 and 592 are removed prior to mounting date wheels assembly 462 to dater/slogan frame 460. It should be noted that the progressive nature of the assembly and the use of L-shaped slots 544, 547, along with alignment holes 538, 594 and pins 540, 592 permits the simple, quick and inexpensive construction and alignment or timing of the assembly.

Cover Assembly

Referring now to FIG. 10, cover assembly 6 is shown to include cover 102 having underside 172 against which batteries 170, keypad 130 and a display assembly 640 are kept in place by support plate 108 fastened to cover 102 by screws 642. Plate 108 has a contour generally corresponding to underside 172; the particular shape of plate 108 is chosen to accommodate batteries 170, keypad 130 and display assembly 640 and keep them in place.

Display assembly 640 includes a liquid crystal display 644 mounted to a PC board 645. A clear protective display case 646 is secured to PC board 645 and covers display 644. Case 646 includes tabs 648 on opposite sides to snap over the edges 650 of PC board 645 to secure the combination of display 644 and PC board 645 therein. A copper shield 652, used for electrostatic discharge protection, is placed between display 644 and case 646. Shield 652 has a central opening 654, to allow the user to view the characters on display 644, and an adhesive, to allow shield 652 to be secured to case 646.

Referring now to FIG. 1C, printhead door 551 is shown slightly ajar above top 88 of cover assembly 24. Door 551 includes a latching surface 656 which engages a corresponding latching surface 658 formed by top 88. However, surfaces 656, 658 do not exactly align. Therefore, as door 551 is pivoted downwardly towards top 88 in the direction of arrow 660, door 551 flexes somewhat to allow edge 656 to snap over and engage edge 658. This provides a very simple latch for door 551. To lift door 551, the user places a finger in depression 662 in top 88 and lifts.

Modification and variation can be made to the disclosed embodiment without departing from the subject of the invention as defined in the following claims.

I claim:

1. A cover assembly for use with a value printing meter, the cover assembly comprising:
    an upper cover including a work side with a display opening and a keypad opening formed therein, the work side having a chosen shape with inner and outer surfaces;
    a lower cover to which the upper cover is secured;
    a keypad positioned at the keypad opening with a portion of the keypad abutting the inner surface of the work side;
    a display assembly positioned at the display opening with a portion of the display assembly abutting the inner surface of the work side; and
    a support plate, having a shape generally corresponding to at least a portion of the chosen shape, mounted to the work side inner surface with the keypad and display assembly captured between the support plate and the work side inner surface to retain the kaypad and display assembly at their respective keypad and display openings.

2. The cover assembly of claim 1 wherein the support plate includes a battery support portion sized to support a battery between the support plate and the work side inner surface.

3. The cover assembly of claim 1 wherein the keypad opening includes an array of key openings.

4. The cover assembly of claim 1 wherein the display assembly includes a display element having a display surface and a display element cover for covering at least the display surface, at least a portion of the display element cover which overlies the display surface being transparent.

5. The cover of claim 4 wherein the display assembly includes a printed circuit board to which the display element is secured.

6. The cover assembly of claim 5 wherein the display element cover includes means for resiliently securing the display element cover to the display element and printed circuit board combination.

7. The cover assembly of claim 1 further comprising a static discharge shield surrounding the keypad.

8. The cover assembly of claim 1 further comprising means for latching the upper and lower covers to one another including complementary tabs and openings carried by the upper and lower covers along one side thereof, a user actuated movable latch, secured to one of the upper and lower covers, for movement along a latching path between latched and released positions and a catch secured to the other of the upper and lower covers positioned for engagement by the latch.

9. The cover assembly of claim 8 wherein the movable latch includes a first inclined surface.

10. The cover assembly of claim 8 wherein the movable latch includes a mounting opening and the one of the upper and lower covers includes a mounting member slidably housed within the mounting opening.

11. The cover assembly of claim 10 wherein the mounting member includes a lip.

12. The cover assembly of claim 11 wherein the mounting opening includes an enlarged portion and a narrowed portion, the narrowed portion sized smaller than a portion of the mounting member including said lip.

13. The cover assembly of claim 9 wherein the catch includes a second inclined surface.

14. The cover assembly of claim 13 wherein the first and second inclined surfaces are inclined along planes aligned with the latching path.

15. The cover assembly of claim 8 wherein the latch is actuated by a screw.

16. The cover assembly of claim 15 wherein the screw is a draw screw.

17. The cover assembly of claim 16 wherein the draw screw includes a head generally aligned with a line of intersection between the upper and lower covers.

18. The cover assembly of claim 17 wherein one of the upper and lower covers includes a tool access opening to provide access to the screw head.

19. The cover assembly of claim 18 further comprising means for blocking access to the access opening.

20. The cover assembly of claim 19 wherein the access blocking means includes a wire secured to the upper and lower covers and passing through the tool access opening.

21. A cover assembly for use with a postage meter, the cover assembly comprising:
a upper cover including work side with a display opening and a keypad opening formed therein, the work side having a chosen shape with inner and outer surfaces;
a lower cover;
means for latching the upper and lower covers to one another including complementary tabs and openings carried by the upper and lower covers along one side thereof, a screw actuated movable latch, secured to one of the upper and lower covers, for movement along a latching path between latched and released positions and a catch secured to the other of the upper and lower covers positioned for engagement by the latch, the movable latch and catch include a first and second surfaces inclined along planes aligned with the latching path, the screw being accessible from outside the cover assembly through a normally sealed access opening;
a keypad positioned at the keypad opening with a portion of the keypad abutting the inner surface of the work side;
a display assembly positioned at the display opening with a portion of the display assembly abutting the inner surface of the work side; and
a support plate, having a shape generally corresponding to at least a portion of the chosen shape, mounted to the work side inner surface with the keypad and display assembly captured between the support plate and the work side inner surface to retain the keypad and display assembly at their respective keypad and display openings.

* * * * *

UNITED STATES PATENT AND TRADEMARK OFFICE
CERTIFICATE OF CORRECTION

PATENT NO. : 4,650,973
DATED : March 17, 1987
INVENTOR(S) : Timothy D. Pike

It is certified that error appears in the above-identified patent and that said Letters Patent is hereby corrected as shown below:

Claim 7, line 2, delete "keypad" and substitute --display--.

Signed and Sealed this

Nineteenth Day of July, 1988

*Attest:*

DONALD J. QUIGG

*Attesting Officer*     *Commissioner of Patents and Trademarks*